US007847701B2

(12) United States Patent
Bajpay et al.

(10) Patent No.: US 7,847,701 B2
(45) Date of Patent: Dec. 7, 2010

(54) PREDICTING CABLE FAILURE THROUGH REMOTE FAILURE DETECTION OF ERROR SIGNATURES

(75) Inventors: Paritosh Bajpay, Edison, NJ (US); Carolyn V. Bekampis, Wayside, NJ (US); Hossein Eslambolchi, Los Altos Hills, CA (US); Nino Girardi, Staten Island, NY (US); Wen-Jui Li, Middletown, NJ (US); David Lu, Morganville, NJ (US); John McCanuel, Bailey, CO (US); John Soares, III, Yonkers, NY (US); Mihail Vasilescu, Middletown, NJ (US)

(73) Assignee: AT&T Intellectual Property II, L.P., Reno, NV (US)

( * ) Notice: Subject to any disclaimer, the term of this patent is extended or adjusted under 35 U.S.C. 154(b) by 170 days.

(21) Appl. No.: 12/166,306

(22) Filed: Jul. 1, 2008

(65) Prior Publication Data
US 2008/0266127 A1   Oct. 30, 2008

Related U.S. Application Data

(63) Continuation of application No. 11/297,581, filed on Dec. 8, 2005, now Pat. No. 7,397,385.

(51) Int. Cl.
*G08B 21/00* (2006.01)

(52) U.S. Cl. ................. 340/652; 340/650; 340/635

(58) Field of Classification Search ............ 340/635, 340/649, 650, 652, 531, 533, 538.18, 538.16, 340/825.01; 370/221, 222, 217; 714/738, 714/775
See application file for complete search history.

(56) References Cited

U.S. PATENT DOCUMENTS

| 5,390,326 | A | * | 2/1995 | Shah | 370/222 |
|---|---|---|---|---|---|
| 5,657,320 | A | * | 8/1997 | Russ et al. | 370/217 |
| 5,790,565 | A | * | 8/1998 | Sakaguchi | 714/738 |
| 6,087,836 | A | * | 7/2000 | Divljakovic et al. | 324/557 |
| 6,392,419 | B1 | * | 5/2002 | Divljakovic et al. | 324/551 |
| 7,194,673 | B2 | * | 3/2007 | Tuttle et al. | 714/775 |

* cited by examiner

*Primary Examiner*—Vasn T. Trieu

(57) ABSTRACT

Computer systems and techniques for predicting a cable failure in a network system begin by receiving a remote alarm indicator followed by a remote alarm indicator clear as a transmission alarm indicator of an intermittent short duration failure on the transmission path of a circuit. If the transmission alarm indicator is of a duration less than or equal to a preset threshold D it is considered an acceptable short hit transmission alarm. When at least N acceptable transmission alarms have been received and the time stamps of the last N acceptable transmission alarms have been recorded, then a determination is made as to whether N acceptable transmission alarms have been received within a preset time period. A moving window time period is calculated as the difference between the time stamp of the present acceptable transmission alarm K and the time stamp of the [(K−N)+1] acceptable transmission alarm. If the difference is less than or equal to T, a cable error signature is indicated. Based on the cable error signature, a cable failure may be predicted.

17 Claims, 3 Drawing Sheets

PREDICTING CABLE FAILURE THROUGH REMOTE FAILURE DETECTION OF ERROR SIGNATURES

CROSS-REFERENCE TO RELATED APPLICATIONS

This application is a continuation of U.S. application Ser. No. 11/297,581, filed Dec. 8, 2005, and entitled, "PREDICTING CABLE FAILURE THROUGH REMOTE FAILURE DETECTION OF ERROR SIGNATURES", currently U.S. Pat. No. 7,397,385, which is incorporated herein by reference in its entirety.

FIELD OF INVENTION

This invention relates generally to cable failure detection and, more particularly, to an approach applicable to predicting cable failure through error signature analysis.

BACKGROUND OF INVENTION

Network organizations are made up of numerous cable connected electrical components such as a switch fabric. For example, a switch fabric may be made up of multiple switch boxes with numerous input and output ports depending upon the signal switching capacity of the switch boxes. While the cable connection organization of the switch boxes may vary depending upon the application, typical network organizations allow for multiple signal paths through the switch fabric to minimize downtime when a failure occurs. Failures may occur at all levels in a network organization including the cables used to connect the various electrical components. Due to diversity of network organizations, cables may vary, for example, in their construction, length, and types of connectors used, with each type of cable having a different failure rate and failure mechanism. One type of cable used in many network organizations is a "Y" type cable that is constructed with a single signal path that is split to two or more connection paths.

As an example, a system having a primary transmit card and a backup transmit card, where the backup transmit card is used if the primary transmit card fails, may use a Y cable that is connected to both transmit cards. The same system, having a primary receive card and a backup receive card, where the backup receive card is used if the primary receive card fails, may use a Y cable that is connected to both receive cards. The use of redundant transmit and receive cards is related to 1+1 equipment protection. A network with 1+1 equipment protection reserves disjoint connection paths in the network for the transmission of data. If one path fails, then the reserved connection path is made available. In operation, duplicate data streams may be sent on both disjoint paths allowing for quick recovery in the event of a failure. For example, if the primary transmit cards fails in transmitting a signal, the backup transmit card will deliver the transmission signal to the Y cable and service is not impacted. In a similar fashion, if the primary receive card fails to receive a transmission signal, the backup receive card is still able to receive the transmission signal, since the Y cable delivers the transmission signal to both receive cards. In either example, the Y cable provides the signal path to keep the service operational. Because of improved system reliability, Y cables are used, for example, to connect between input and output ports of multiple switch boxes used in a switch fabric with a 1+1 protection configuration. However, even Y cables may fail, and when a Y cable fails, as may occur over time due to physical failure of solder joints, for example, finding the specific Y cable that has failed can be difficult and time consuming.

SUMMARY OF INVENTION

Among its several aspects, the present invention addresses methods and apparatus for determining a cable error signature in a network system. To such ends, a method in accordance with one aspect of the invention begins by receiving a remote alarm indicator and followed by a remote alarm indicator clear within a time period D. The method then sets an indication of a short hit intermittent failure. It is then determined that N short hits have occurred within a time period, T.

Another aspect of the invention addresses a computer system for predicting a cable failure in a network system. The computer system comprises means for receiving a remote alarm indicator followed by a remote alarm indicator clear as a short hit indicator of an intermittent transmission failure in the network system. Also, included in the computer system are means for reporting alarms to programs running on the computer. To run a program, the computer system also has a memory specifically containing a rules based program for determining the cable error signature with the rules based program being invoked by the reported alarms. Means are also provided for determining that a sequence of N short hit alarms, each of a duration less than or equal to D, is received in a monitoring period less than or equal to T as a cable error signature. Based on the cable error signature the computer system predicts a cable failure.

A more complete understanding of the present invention, as well as other features and advantages of the invention, will be apparent from the following detailed description and the accompanying drawings.

DETAILED DESCRIPTION

The present invention will now be described more fully with reference to the accompanying drawings, in which several embodiments and various aspects of the invention are shown. This invention may, however, be embodied in various forms and should not be construed as being limited to the embodiments set forth herein. Rather, these embodiments are provided so that this disclosure will be thorough and complete, and will fully convey the scope of the invention to those skilled in the art.

Figure 1A:
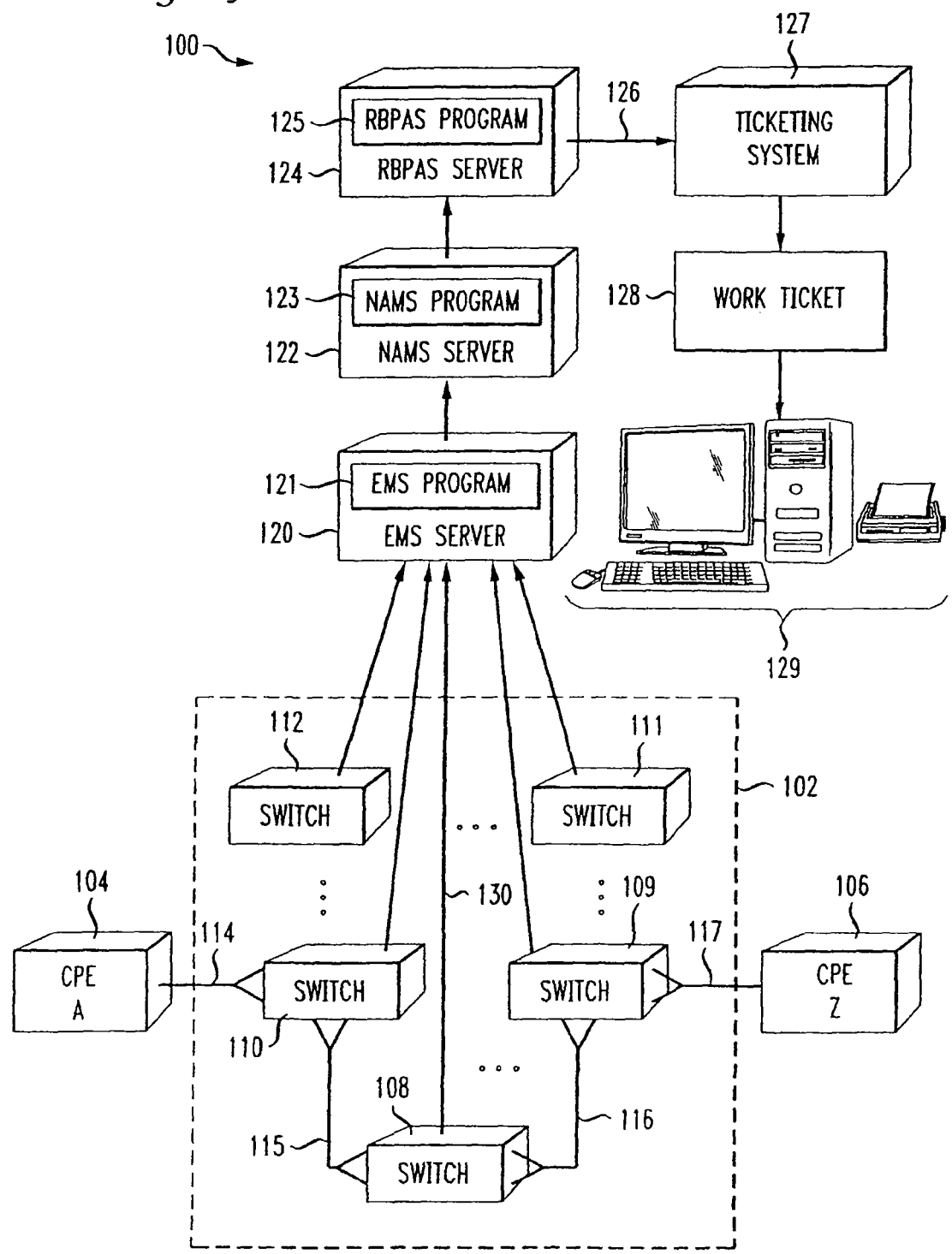
FIG. 1A illustrates a control network organization having a switch fabric connecting a first customer premises equipment (CPE) with a second CPE in accordance with the present invention.

FIG. 1A illustrates a control network organization 100 having a switch fabric 102 connecting a first customer premises equipment (CPE-A) 104 with a second CPE-Z 106. The switch fabric 102 is made up of multiple switch boxes 108-112, where each switch box may be, for example, an asynchronous transfer mode (ATM)/frame relay switch. The switch boxes 108-112 are interconnected using various types of cables, including, for 1+1 protection, Y cable assemblies 114-117 which are discussed in more detail below.

Each switch box 108-112 communicates with an element management system (EMS) server 120 to report status, alarms, and error conditions and to configure and control the switch boxes 108-112. A server is a processing system having one or more processors, memory, input/output units of high capacity and performance, such as large capacity disk drives and communication devices, and may have a keyboard, a display, and a printer. Server programs, such as may be provided in computer readable media, may be loaded from a disk drive or downloaded through a communication device, for example. A server runs software programs, such as an EMS software program 121. The EMS server 120 communicates with a network alarm management systems (NAMS) server 122, for example, by the use of software traps that are internally generated upon detecting various alarms from the monitored switch fabric 102.

The NAMS server 122 runs a NAMS software program 123 operative to monitor the whole maintained network made up of different types of network elements, including multiple separate EMS systems, such as the EMS server 120 and its associated switch fabric 102. The NAMS server 122 further communicates with a rules based process automation system (RBPAS) server 124 which runs an RBPAS software program 125. Both the NAMS program 123 and the RBPAS program 125 are exemplary rule based software programs configured to automate tasks within their domain. For the NAMS server 122 and NAMS program 123, the domain of operation is alarm management and for the RBPAS server 124 and RBPAS program 125, the domain of operation is automation of manual processes executed by technicians in support and service of the network.

The RBPAS program 125 may be operative on a single server or a cluster of servers separate from the EMS server 120 and the NAMS server 122. The RBPAS program 125 generates a request for a work ticket 126 dependent upon the work action required. A network wide ticket generation system 127 generates a work ticket 128 that may be sent to a computer 129 in a work center that is able to respond to an action specified in the work ticket 128. The work ticket 128, as an electronic message, provides information that is used to generate a specific action, such as a preventive maintenance action, to resolve the detected problem.

Figure 1B:
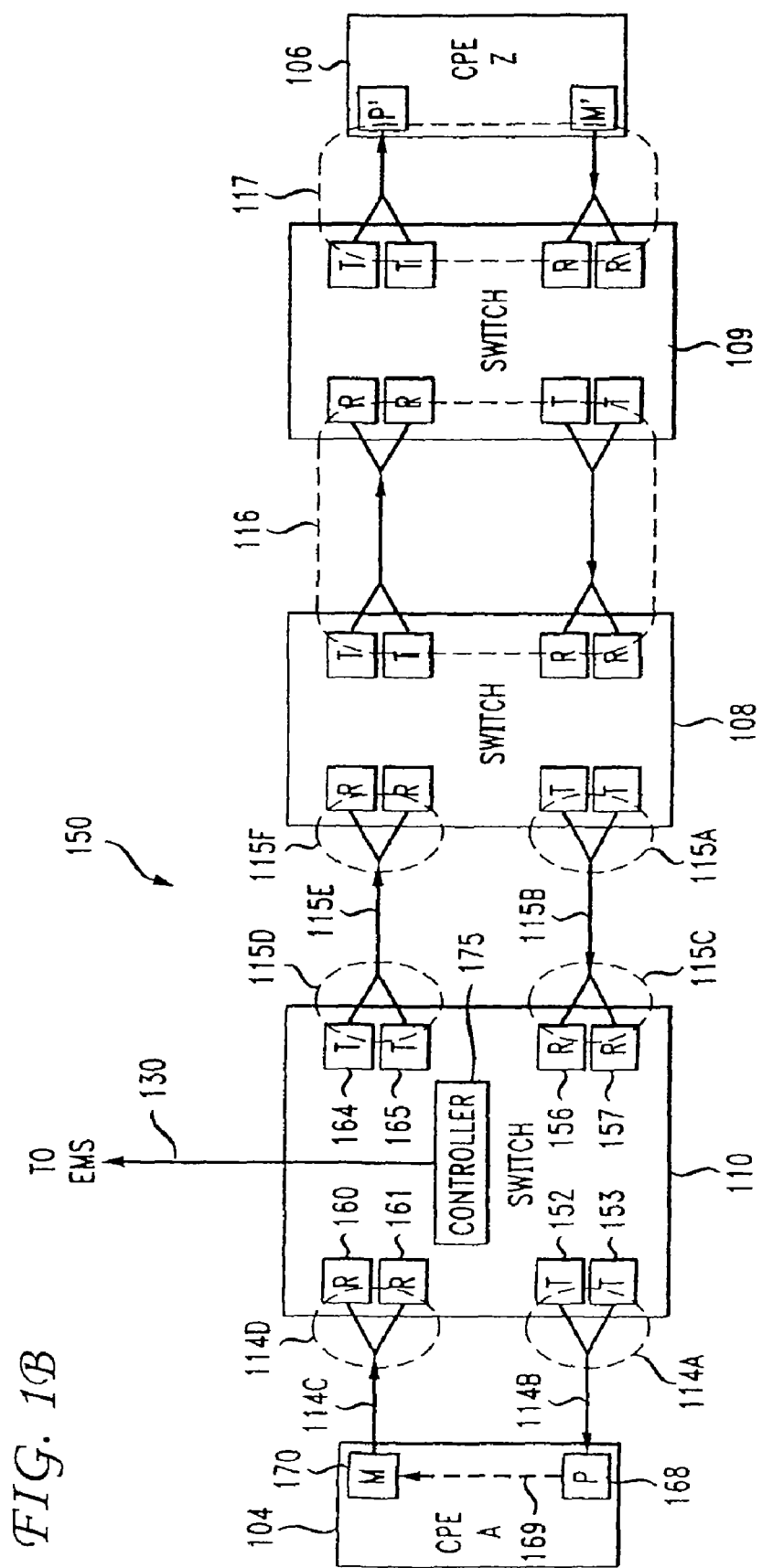
FIG. 1B illustrates further details of a connection path through the switch fabric of FIG. 1A from the first CPE to the second CPE in accordance with the present invention.

FIG. 1B illustrates details of an exemplary connection path through the switch fabric 102 from CPE-A 104 to CPE-Z 106. The switch boxes 108-110 are shown in greater detail in FIG. 1B illustrating, for 1+1 protection, the use of Y cables on the transmit and receive connection paths. The switch boxes 108-110 make use of primary and backup receive and transmit cards. For example, switch box 110 has on the transmit path, a primary transmit card 152, a backup transmit card 153, a primary receive card 156, and a backup receive card 157. The switch box 110 has on the receive path, a primary receive card 160, a backup receive card 161, a primary transmit card 164, and a backup transmit card 165. The CPE-A 104 may suitably employ a wide variety of passive and electronic equipment which are generically illustrated as receiver P 168, connection path 169, and transmitter M 170. For example, receiver P 168 may be implemented by a server on the customer premises having an internal receiver card, the transmitter M 170 may be a transmit card on the server, and the connection path 169 may be internal to the server having the receiver P 168 and transmitter M 170.

The Y cable assembly 115 between the switch boxes 108 and 110 is made up of a transmit path and a receive path. The transmit path for Y cable assembly 115 comprises transmit Y cable 115A, a connecting cable 115B, and a receive Y cable 115C. The receive path for Y cable assembly 115 comprises transmit Y cable 115D, a connecting cable 115E, and a receive Y cable 115F. The Y cable assembly 114 between the switch box 110 and CPE-A 104 is made up of a transmit and a receive path. The transmit path for Y cable assembly 114 comprises transmit Y cable 114A and a connecting cable 114B. The receive path for Y cable assembly 114 comprises a connecting cable 114C and a receive Y cable 114D. It is noted that additional electronic equipment, such as signal repeaters, which may be located between the switch boxes, are not shown for ease of illustrating the present invention.

Depending upon the failure mechanism for a passive or an electronic component, be it a cable or a transmit card, for example, a failure may be able to be predicted based on supporting information, such as increased short duration alarms and error rates. For example, a Y cable, when it begins to fail on the transmit path, may exhibit gradual or widely intermittent failures that are recognized on a receiving card by an intelligent device, such as the primary receive card 160. Each receive card and each transmit card has one or multiple ports, where each port refers to the signal interface use by the card. A receiving port using a cyclic redundancy check (CRC) on a transport layer interface interconnected with a Y cable, may start experiencing a gradual increase in the number of CRC errors associated with a failure of the Y cable. Intermittent loss of signal is another example that can be detected on the signal interface with a failing Y cable. Each error detected, such as a CRC error or a loss of signal error, is recorded, for example, in a performance monitor count, or an alarm is generated at the switch box containing the card that detected the error, such as, switch box 110 containing the primary receive card 160. When an alarm is generated, the alarm is communicated to the EMS server 120.

As an example of a failure detection scenario, assume that CPE-Z 106 transmits data to CPE-A 104 and the Y cable 114A is starting to fail intermittently and gradually. The Y cable 114A failure causes, for example, a loss of signal event during a transmission from switch box 110 to CPE-A 104. The receiver P 168 recognizes a transmission failure has occurred and that the transmission failure is considered remote from the CPE-A 104. The detected transmission failure is passed over connection path 169 to transmitter M 170. Transmitter M 170 transmits a remote failure message on the receive path that indicates a failure was detected on the transmission path. The failure message is sent over connecting cable 114C to Y cable 114D. Both the primary receive card 160 and the backup receive card 161 receive the failure message that was transmitted. Assuming no additional failure exists, the primary receive card 160 notifies a controller 175 in the switch box 110 of the failure.

While other failure types and messages exist, this detected failure message causes a receive (RCV) remote alarm indicator (RAI) signaling that a problem exists on the transmit path from CPE-Z 106 to CPE-A 104. The RCV RAI alarm is sent by the controller 175 in switch box 110 over a connection 130 to the EMS server 120. The transmit Y cable 114A failure may generate a single or multiple short hits, where a short hit is defined as an error condition followed by an immediate clear condition. The duration of the failure may vary, causing the duration of the alarm condition, from the alarm being set to the alarm being cleared, to also vary. When an RCV RAI (receive remote alarm indicator) alarm goes away, due to error free transmissions occurring across the Y cable 114A, an RCV RAI Clear indication is given. For example, a sequence of alarms and clears, RCV RAI, RCV RAI Clear, may be sent from the controller 175 in switch box 110 to the EMS server 120. Error free transmissions may then continue across the Y cable 114A until another failure in the Y cable 114A occurs and is again detected as a RCV RAI alarm. Each alarm is communicated to the NAMS program 123 running on the NAMS server 122 by use of a suitable mechanism for the communications of alarms.

Related to the sequencing of set alarm and clear alarm, three parameters may be defined. For example, a first parameter is an alarm duration D representing the time period between an RCV RAI alarm and its related clear. A second parameter is a time period for monitoring alarms, T. A third parameter is a number of alarms, N. In addition, a threshold is set for each of the three parameters. For example, a threshold for D is set requiring an alarm condition to be less than or equal to the threshold for D before being taken into account as a short alarm condition. If an alarm condition is longer than D, then a different failure procedure may be used to diagnose the problem associated with the long failing condition.

For example, if a sequence of N=5 alarms, each of duration less than D=2 seconds, is received in a monitoring period of T equal to ten hours, then a cable error signature is indicated. The cable error signature is recognized by the NAMS program 123 and reported to the RBPAS program 125. The RBPAS program 125 uses rules to examine the cable error signature and may require additional constraints per each specific maintenance process definition. A trend analysis indicating whether the problem is getting worse or better may be implemented in the RBPAS program 125 before generating a work action request to the ticketing system 127. The ticketing system 127 generates a work ticket 128 that may specify a repair action.

A received sequence of N=5 alarms, each of duration less than D=2 seconds, that are received in a T=ten hours monitoring period may represent the error signature of the event being monitored as a predictor that the problem may only deteriorate. For example, if the problem is not addressed at the time the error signature is detected, a further increase in the number of errors being received is predicted. To avoid a deteriorating failure condition of Y cable 114A, for example, a work ticket for replacing the specific Y cable 114A, such as work ticket 128, is issued to a computer 129 in a work center where a technician may be dispatched to replace the failing Y cable 114A.

Figure 2:
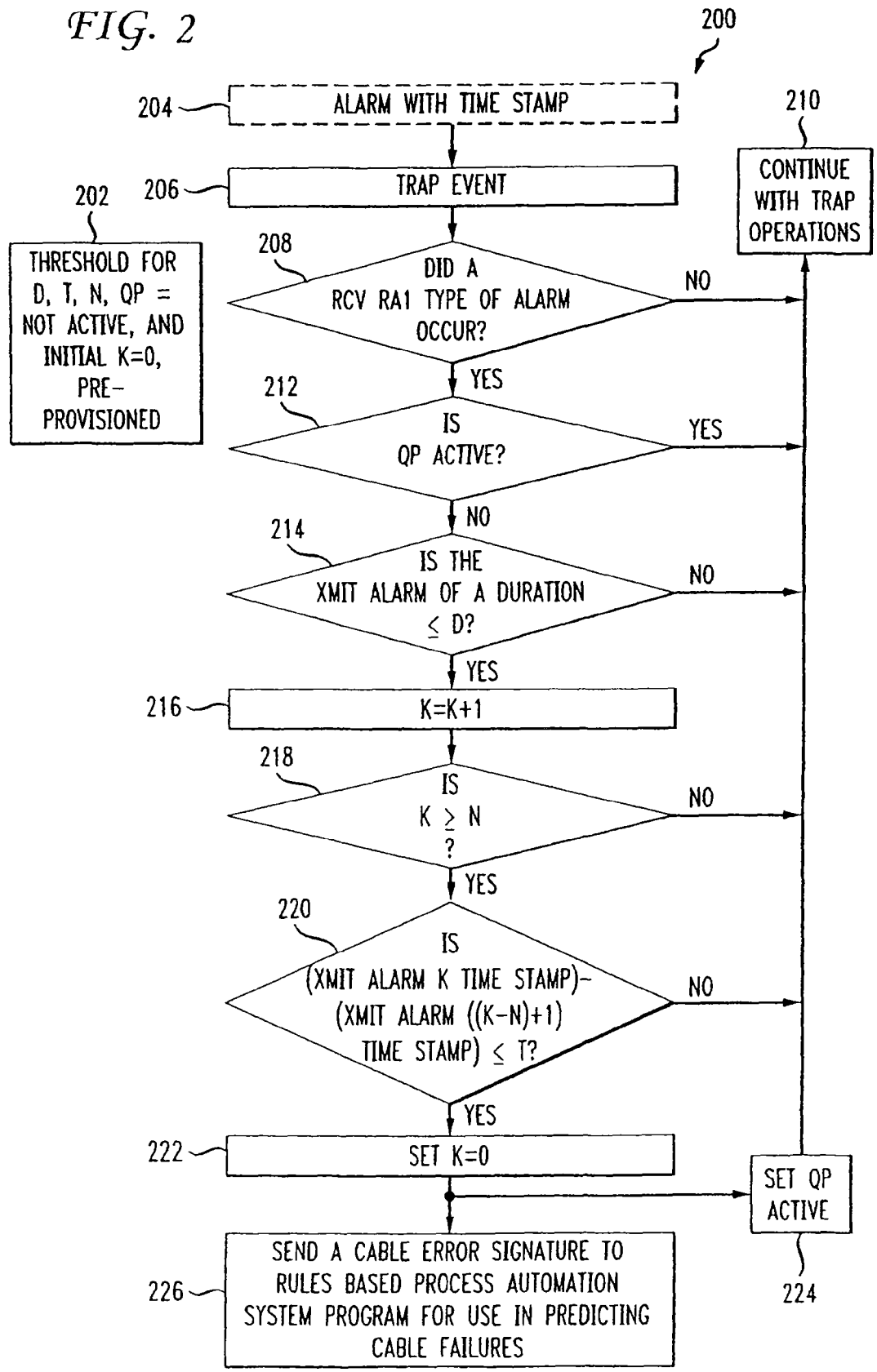
FIG. 2 illustrates a method for predicting a cable failure in accordance with the present invention.

FIG. 2 illustrates a rules based method 200 for predicting a cable failure operable as a program that is run on the NAMS server 122. The rules based method 200 includes a step 202 for pre-provisioning threshold values for duration D, monitor time period T, number of short hit alarms N, quiet period (QP) initially set as not active, and for setting an initial value of an alarm index K to zero. K is a variable used to count the number of short hit alarms received. The rules based method 200 may be operative in the NAMS server 122 when an alarm with a time stamp 204 initiates a trap event 206. In decision step 208, it is determined whether the alarm trap is for an RCV RAI type of alarm. An RCV RAI type of alarm may be an RCV RAI alarm or an RCV RAI clear alarm. If the trap event is not an RCV RAI type of alarm, the method continues with other trap operations in step 210 to determine what, if any, additional trap processing should occur. The other trap operations of step 210 may include, for example, processing steps that deal with other types of alarms. Additional trap operations suitable for step 210 are discussed in further detail below If it is determined in decision step 208 that the trap event is for an RCV RAI type of alarm, then the method proceeds to decision step 212. In decision step 212, a check is made whether the quiet period is active as will be explained in more detail below. If the quiet period is active, then the method continues with other trap operations in step 210. If the quiet period is not active, as indicated at the end of the quiet period, the method continues with decision step 214.

In decision step 214, it is determined whether a time period, as measured from an RCV RAI alarm to an RCV RAI clear alarm, is less than or equal to D. The sequence of receiving the RCV RAI alarm followed by the RCV RAI clear alarm is referenced as an XMIT alarm having a variable duration depending upon the duration of the failure causing the RCV RAI alarm. If the duration of the Xmit alarm is greater than D, the method proceeds to step 210 which determines what, if any, additional trap processing should occur. For example, the other trap operations of step 210 for Xmit alarms of duration greater than D, may include the use of different diagnostic procedures to troubleshoot these long duration failure indications.

In decision step 214, if the duration of the Xmit alarm is less than or equal to D, then it is an acceptable Xmit alarm and considered a short hit intermittent failure. The process then proceeds from decision step 214 to step 216. In step 216, the value of K, as alarm index, is incremented by 1, for example, in a counter. In decision step 218, it is determined whether the number of short hit alarms, indicated by the alarm index K, is less than or greater than or equal to the short hit alarm threshold N. If the number of short hit alarms is less than N, the process proceeds to step 210 to continue with trap operations. If it is determined in decision step 218 that the number of acceptable Xmit alarms is greater than or equal to N, the process proceeds to decision step 220. It is noted that the time stamps of acceptable transmission alarms are usually part of the alarm information and are available for access by programs running on the NAMS server 122.

A moving window monitor period is a time period that advantageously adjusts (slides) to the current value of the alarm index K that has a count of the number of short hit alarms received. The moving window monitor period is a moving window of time beginning from the time stamp of the short hit alarm ((K−N)+1) to the time stamp of the present short hit alarm K. The moving window can also be viewed as covering the period of time from the present short hit alarm K backwards for the N−1 previous short hit alarms. For example, if the short hit alarm threshold N is six and the current K is fifteen, then the time stamp for the short hit alarm 10=((15−6)+1) is subtracted from the time stamp for the short hit alarm K=15 which covers the time period for the six short hit alarms ten through fifteen. This result can also be viewed as the time period beginning with the present short hit alarm 15 and covering the period for the previous five short hit alarms. The moving window monitor period is advantageously used in decision step 220.

In decision step 220, the time stamp for acceptable Xmit alarm number ((K−N)+1) is subtracted from the time stamp for the present acceptable Xmit alarm K with the result compared to the threshold T. If the time period from the short hit alarm ((K−N)+1) to the present short hit alarm K is greater than T, then the process proceeds to step 210 to continue with trap processing. This result means that N alarms were received in a period of time greater than T and does not meet the rules as specified in step 220. If the time period from the short hit alarm ((K−N)+1) to the present short hit alarm K is less than or equal to T, then the process proceeds to step 222.

In step 222, K is reinitialized to zero to start a new cycle of checking for a cable error signature. In step 224, a quiet period (QP) is set active. The quiet period is a programmable time provided for evaluation and repair of failures indicated by the cable error signature. For example, QP may be set to 3 days for a large network system while in another system, the QP might be set to less than a day. In step 226, a cable error signature is sent to the RBPAS program 125 for use in predicting cable failures. The RBPAS program 125 evaluates the cable error signature and locations in the network system reporting cable error signatures to isolate a specific location as a probable location of the cable failure. The RBPAS program 125 generates a request for a work ticket 126 to ticketing system 127. A work ticket 128 is then generated and sent to the work center associated with the probable location of the cable failure to cause the located cable, such as a Y cable, to be replaced.

While the present invention has been disclosed in a presently preferred context, it will be recognized that the present teachings may be adapted to a variety of contexts consistent with this disclosure and the claims that follow.

For example, the present invention is disclosed mainly in the context of predicting Y cable failures in a network system with 1+1 protection. It will appreciated that it may also be employed with other systems using different types of cables for interconnecting between multiple nodes in a transmission path or may detect hardware/software failures on the transmission path, such as may occur in transmit electronic cards, for example. It will also be appreciated that variations in the particular hardware and control process employed are feasible, and to be expected as both evolve with time. For example, rules governing types of intermittent errors that can be detected, duration of intermittent errors, and number of intermittent errors received in a monitoring time period may be adjusted due to changes and improvements in cables and transmission protocols. Other such modifications and adaptations to suit a particular design application will be apparent to those of ordinary skill in the art.

We claim:

1. A method, comprising:
   receiving a remote alarm indicator;
   receiving a remote alarm indicator clear within a first time period;
   setting an indication of a short hit intermittent failure; and
   determining that a number of short hits occurred within a second time period.

2. The method of claim 1, wherein the remote alarm indicator is an indicator of a transmission failure detected in a specific receiver location in a network system.

3. The method of claim 2, wherein the remote alarm indicator clear is an indicator that a non-failing transmission occurred after the transmission failure was detected in the specific receiver location.

4. The method of claim 1, wherein the first time period and the second time period are preset programmable time thresholds.

5. The method of claim 1, wherein the number of short hits is a preset programmable threshold.

6. The method of claim 1 further comprising:
   indicating a cable error signature has occurred; and
   sending the cable error signature to a rules based process automation system.

7. A computer system for predicting a cable failure in a network system, comprising:
   means for receiving a remote alarm indicator followed by a remote alarm indicator clear as a short hit indicator of an intermittent transmission failure in the network system;
   means for reporting alarms to programs running on a computer;
   a memory containing a rules based program for determining a cable error signature, the rules based program invoked by the reported alarms;
   means for determining that a sequence of a number of short hit alarms, each of a duration less than or equal to a first time period is received in a monitoring period less than or equal to a second time period as a cable error signature; and
   means for predicting a cable failure based on the cable error signature.

8. The computer system of claim 7, wherein the remote alarm indicator is an indicator of a transmission failure detected in a specific receiver location in the network system.

9. The computer system of claim 8, wherein the remote alarm indicator clear is an indicator that a non-failing transmission occurred after the transmission failure was detected in the specific receiver location.

10. The computer system of claim 7, wherein the short hit alarm has a duration as measured from receiving a remote alarm indicator to receiving a remote alarm indicator clear.

11. The computer system of claim 7, wherein the first time period and the second time period are preset programmable set time thresholds.

12. The computer system of claim 7, wherein the number of short hits is a preset programmable threshold.

13. The computer system of claim 7, further comprising:
   means for communicating the cable error signature to a rules based process automation system program to predict a specific cable failure.

14. The computer system of claim 13, further comprising:
   means for evaluating a plurality of cable error signatures and locations associated with the reported error signatures to predict a probable location of failure.

15. The computer system of claim 14, further comprising:
   means for requesting a work ticket to fix the probable location of failure.

16. The computer system of claim 15, wherein the work ticket specifies a cable replacement at the probable location of failure.

17. The computer system of claim 16, wherein the specified cable is a Y cable.

* * * * *